United States Patent [19]

Fromson et al.

[11] 4,338,007
[45] Jul. 6, 1982

[54] APPARATUS AND PROCESS FOR MAKING LITHOGRAPHIC PRINTING PLATE WITH REINFORCED IMAGE

[75] Inventors: Howard A. Fromson, 15 Rogues Ridge Rd., Weston, Conn. 06880; Robert F. Gracia, Scituate, Conn.

[73] Assignee: Howard A. Fromson, Weston, Conn.

[21] Appl. No.: 142,507

[22] Filed: Apr. 21, 1980

Related U.S. Application Data

[63] Continuation of Ser. No. 972,561, Dec. 22, 1978, abandoned.

[51] Int. Cl.³ .................. G03B 27/30; B41M 5/00; G03F 7/02; G03C 1/76
[52] U.S. Cl. .................. 355/100; 101/463.1; 430/156; 430/269; 430/328
[58] Field of Search ............... 354/354, 297, 317, 323; 101/471, 472, 453, 463.1, 458.1, 466, 467; 355/125, 132, 133, 85, 100, 78; 430/155, 156

[56] References Cited

U.S. PATENT DOCUMENTS

| | | | |
|---|---|---|---|
| 2,941,499 | 6/1960 | Gutzmer | 118/11 |
| 3,145,104 | 8/1964 | Oster et al. | 101/467 X |
| 3,520,606 | 7/1970 | Gush et al. | 355/85 |
| 3,669,329 | 6/1972 | Blanchet et al. | 226/108 |
| 3,682,636 | 8/1972 | Krueger | 101/463.1 X |
| 3,808,004 | 4/1974 | Thomas et al. | 430/156 |
| 3,905,815 | 9/1975 | Bonham | 430/156 |
| 3,905,815 | 9/1975 | Bonham | 430/156 |
| 3,936,853 | 2/1976 | Mart | 354/317 X |
| 3,981,583 | 9/1976 | Tsuchida et al. | 355/100 |
| 4,020,762 | 5/1977 | Peterson | 101/471 X |
| 4,038,253 | 7/1977 | Kramer | 101/453 X |
| 4,042,613 | 8/1977 | Takamizawa et al. | 101/463.1 X |
| 4,104,072 | 8/1978 | Golda et al. | 430/155 |
| 4,178,097 | 12/1979 | Sara | 355/100 |
| 4,232,105 | 11/1980 | Shinohara et al. | 430/155 X |

FOREIGN PATENT DOCUMENTS

| | | |
|---|---|---|
| 1597778 | 4/1967 | Fed. Rep. of Germany . |
| 1931323 | 6/1969 | Fed. Rep. of Germany . |
| 2514864 | 10/1975 | Fed. Rep. of Germany . |
| 2725308 | 12/1977 | Fed. Rep. of Germany . |
| 2838707 | 3/1979 | Fed. Rep. of Germany . |
| 2340566 | 9/1977 | France . |
| 2402231 | 3/1979 | France . |
| 7553109 | 12/1975 | Japan . |
| 1109521 | 4/1968 | United Kingdom . |

OTHER PUBLICATIONS

Chem. Abstracts, vol. 83, 1975.
Research Disclosure, No. 142, Feb. 1976.
Kodak et al: "Increasing Press Life of Lithio Plates".

*Primary Examiner*—Donald A. Griffin
*Attorney, Agent, or Firm*—Felfe & Lynch

[57] ABSTRACT

Lithographic printing plates are made by exposing to actinic light a lithographic plate having a water soluble light sensitive layer thereon and a coating of a solvent soluble, UV curable material thereover to form an image in the light sensitive layer and adhere said layer to the overlying UV curable material. The plate is developed with water to remove light sensitive layer and overlying UV curable material in the non-image areas, and the plate is exposed to UV source having an intensity greater than the imaging light to form a press-ready plate having a durable, reinforced cured image thereon.

2 Claims, 1 Drawing Figure

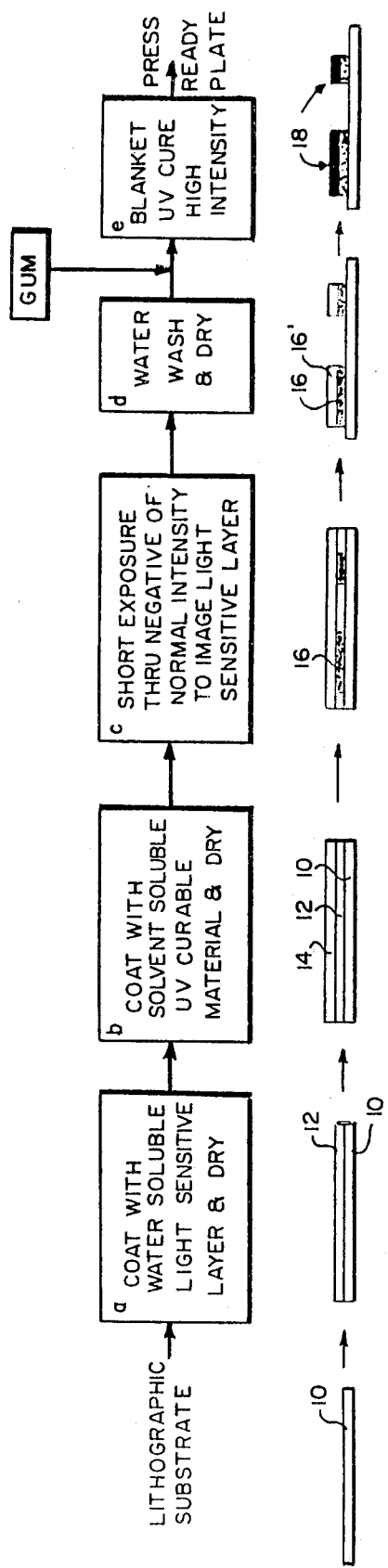

APPARATUS AND PROCESS FOR MAKING LITHOGRAPHIC PRINTING PLATE WITH REINFORCED IMAGE

RELATED APPLICATION

This application is a continuation of copending application Ser. No. 972,561, filed Dec. 22, 1978, now abandoned.

BACKGROUND

This invention relates to a process and apparatus for making press-ready lithographic printing plates having a durable, reinforced, cured image thereon wherein the image is formed and reinforced in two separate exposure steps, the first to form the image, and the second to cure or cross link the image.

Lithographic printing techniques, using, for example, anodized and silicated aluminum base plates such as described in Fromson U.S. Pat. No. 3,181,461 issued May 4, 1965, have come into widespread use in the printing industry and especially in offset printing and direct lithographic printing by newspapers using converted letterpress printing presses.

A conventional negative working lithographic printing plate of this type has a coating of a light sensitive substance that is adherent to the aluminum base sheet after exposure. If the light sensitive coating is applied to the base sheet by the manufacturer, the sheet is referred to as a "presensitized plate". If the light sensitive substance is applied to the base by the lithographer or trade plate maker, the plate is referred to as a "wipe-on plate". Depending on the nature of the photosensitive coating employed, a coated plate may be utilized to reproduce directly the image to which it is exposed, in which case it is termed a positive-acting plate, or to produce an image complementary to the one to which it is exposed, in which case it is termed a negative acting plate. In either case, the image area of the developed plate is olephilic and the nonimage area is hydrophilic.

In the case of a negative working plate, the surface is coated with an aqueous solution of a conventional diazo resin. The plate is dried and exposed through a negative. The exposed image areas become water insoluble and the unexposed non-image areas remain water soluble. The plate is conventionally developed with a lithographic lacquer which consists of a two-phase system, one phase containing an oleophilic resin and the other phase a hydrophilic gum. Upon application, the oleophilic resin adheres to the exposed insoluble areas, while the hydrophilic phase dissolves away the unexposed soluble non-image areas. In this way, the image areas are made oleophilic or ink receptive and the non-image areas are made hydrophilic or ink repellent.

The use of a lithographic lacquer as described above represents one way of reinforcing an image on a lithographic printing plate. Other ways have been sought to reinforce the image to make it more durable and increase the press-life of the plate. For example, in Fromson U.S. Pat. No. 3,773,514, a tough, wear-resistant solvent insoluble protective layer is applied to the light sensitive coating before imaging and developing the plate.

Another proposal is set forth by Adams et al. in U.S. Pat. No. 3,669,664 wherein a fully exposed image on a developed lithographic plate is reinforced by treating the developed plate with a lacquer made of a dispersion in water of a solution of a photopolymerizable resin in an organic solvent. The treated image can be further strengthened by exposure to actinic light and/or heat. This approach, however, is time consuming and cumbersome because it starts with a conventionally exposed and developed lithographic plate. This is an additional procedure which in fact lengthens the time required for making a pressready plate. In the case of lithographic printing of newspapers where speed and efficiency is a critical factor this approach has serious drawbacks.

Another proposal is set forth by Bonham in U.S. Pat. No. 3,905,815 wherein a base sheet is provided with a coating of a diazo resin over which is provided a photopolymerizable layer. The latter is designed such that, for a given exposure, its rate of polymerization and insolubilization is at least as great as the rate of insolubilization of the diazo resin layer. This requires precise matching of the characteristics of the two layers and image formation and curing are carried out during exposure of the dual coated base sheet through a negative. This provides no advantage over a conventional diazo coated lithographic substrate from the standpoint of increasing the efficiency of the plate making operation.

SUMMARY

The present invention provides apparatus and method for the two-stage imaging and curing of lithographic plates which are characterized by a substrate coated with a first layer of water soluble light sensitive material which when exposed to light will adhere to the substrate and a second overlying layer of a solvent soluble UV curable material which is capable of being cured by UV light having an intensity substantially greater than the light required to image the water soluble light sensitive layer.

The process of the invention can be characterized as a subtractive process which includes the steps of:

(1) exposing to actinic light through a lithographic plate having a water soluble light sensitive layer thereon and an overcoating of a solvent soluble, UV curing material, the intensity of said light being sufficient to form an image in the light sensitive layer and to adhere the image to the overlying portions of the UV curable material and the underlying plate without curing the UV curable material;

(2) developing the plate with water to remove the light sensitive layer and overlying curable material in the non-image areas; and (3) exposing the plate to a UV source having an intensity greater, preferably ten times greater, than the imaging light used in step (1) which is sufficient to cure the UV material adhered to the image to form a press-ready plate having a durable, reinforced, cured image thereon.

It is preferred that the intensity and duration of the exposure in step (1) be sufficient to form a latent image in the light sensitive layer. Latent image means the following: under normal conditions a diazo-coated plate must be exposed for a minimum period of time. The exposure time is such that a proper balance of image quality and image adhesion or toughness is achieved. Traditionally the proper exposure time is arrived at by using a Stauffer-Gray Scale. This is a 21-step scale which increases in grayness linearly from zero to 3 as measured by a densitometer. The optimum reading on this scale which gives best results for most lithographic printing plates is a solid step 6 or a 7 showing on the scale after development with conventional light sources, i.e., carbonarc, xenon, mercury vapor. The time value for proper exposure is between 60 and 120 seconds depending on the light source. In this invention, the exposure time for a diazo-coated plate (coated at a constant ratio of one-half to one percent solution) is between one and ten seconds with these same conventional light sources. After exposure there is no visible image. The visible image does appear upon development. It is this invisible or ghost image which is referred to as a latent image. Upon development, an intense image results. Relative to a Stauffer Scale reading, the invention initially exposes to a solid step 1 or 2 which would be almost useless on other types of plates.

For example, when using a diazo resin for the light sensitive layer, the exposure through a negative need only be for a very short duration (5 to 10 seconds) which is sufficient to form the latent image. Under normal conditions in lithographic plate preparation, a diazo resin must be exposed to an intensity of actinic light long enough to form an oleophilic visible image which is lacquerable. This requires a much greater length of time in the order of minutes as compared to the seconds required to form a latent image according to the invention.

Apparatus of the invention for carrying out the process includes means for accomplishing the various steps outlined above, namely:

(1) A diazo-coated plate.
(2) Applicator means for the UV coating.
(3) Means for the first latent image exposure.
(4) Developing means to remove excess (non-image) diazo and overlying UV resin.
(5) Means to rinse and gum the plate.
(6) High intensity blanket UV exposure means to cure the reinforced image at speeds of 2 to 100 feet per minute.

DESCRIPTION OF THE DRAWING

The present invention will be more fully understood from the following description taken in conjunction with the accompanying drawing which is a flow diagram for carrying out the invention.

DESCRIPTION

Referring to the drawing, the invention involves coating a lighographic substrate 10 with a water soluble light sensitive layer 12 followed by drying (step a). The coated substrate 10 is then overcoated with a solvent soluble UV curable material 14 and again dried (step b). In step (c) in the flow diagram, the coated substrate is exposed to actinic light to form a latent image 16 in the light sensitive layer 12 and to adhere the latent image 16 to the overlying portion of the curable coating 14. The intensity and duration of the exposure to form the latent image 16 in the light sensitive layer 12 is sufficient in a preferred embodiment to form only a latent image without curing the UV curable coating 14. The invention can also be carried out using an image intensity greater than needed to form the latent image.

Following step (c), the plate is water developed which removes light sensitive layer 12 and the overlying UV curable material 14 in the non-image areas leaving the imaged portion 16 of the light sensitive layer with the overlying portion 16' of the UV curable material.

Following the water wash step, an optional feature involves wiping or rubbing with a conventional hydrophilic gumming material to improve the hydrophilic properties of the plate. After this the imaged and developed plate is given a blanket exposure to a high intensity source of UV light which is sufficient to cure the UV material 16' to form a press-ready plate having a durable, reinforced cured image 18 thereon. The UV exposure in step (e) is of an intensity which is at least twice as great as the intensity used for the exposure in step (c). Rubbing with a gumming material can also follow step (e) rather than after or in addition to the water wash step.

In most cases, the image forming step through a negative will require an exposure of conventional intensity—e.g., 1–10 watts/in$^2$ for 1 to 10 or more seconds. Generally, the blanket UV curing step uses a UV source that delivers 50–500 watts/in$^2$. Generally, the UV curing step can be carried out in a matter of seconds, e.g., from 0.1 to 5 seconds. The UV curable material is not cured or cross-linked by the actinic light used in the image forming step.

The invention can be described with reference to the preferred use of a water soluble diazo resin for the light sensitive layer 12 as follows.

A water-soluble diazo sensitized plate is overcoated with a solvent soluble UV sensitive resin and dried. This twice coated plate is used in the same fashion as a pre-sensitized plate but using two exposure steps, the first to form the latent image in the diazo resin layer and adhere the UV sensitive resin to the diazo resin in the image area, followed by a second blanket exposure step, after development of the plate with water, to cure the UV sensitive resin with a high intensity UV light source as described above.

Actinic light from a laser can be used to form a latent image. A YAG laser light source such as the Log-E machine by Log-E-Tronics, or an Argon-Ion light source such as the Laserite made by EOCOM, is preferred. The steps are the same as above.

The present invention offers the following advantages over the prior art.

By separating out the phase of forming the image from that of curing the image, four advantages are realized:

1. Speed—it is now possible to image the plate in as little as one or ten seconds as compared to a normal exposure on the order of 75 seconds or more for a diazo resin.

2. Run length—the UV curable material made up of monomers and/or oligomers is cured quickly under very powerful UV light source to form an extremely tough image. This results in a lithographic printing plate with a durable, long-lasting image capable of running on a press for 250,000 impressions or more.

3. Material savings—the invention results in substantial savings in paper waste, ink and lacquer because it minimizes plate changes as well as the time of preparation. The plate is extremely oleophilic and start-ups are extremely rapid.

4. Technological advantages—it is now possible for the first time to image an additive wipe-on plate with a laser and eliminate the need for negatives.

The invention also substantially eliminates the need for conventional development lacquers and their concomitant waste problems due to the presence of solvents, pigments and acids.

In a conventional diazo sensitized lithographic printing plate, the initial exposure not only images a plate but also cures the image which is required for durability on the press. The art uses a standard known as the Stouffer Gray Scale and it is generally recognized that an exposure producing a solid 6 is necessary to achieve the sufficient toughness and abrasion resistance in the final image on the plate. According to the present invention using a much shorter exposure for forming the latent image, it is possible with a solid 1 or 2 on the Stouffer scale to achieve the same results that normally are only achieved with a solid 6 or more on a conventional plate. The invention does not depend on the initial exposure for imparting toughness to the image and only seeks to form a latent image. This greatly reduces the time required because the duration of the exposure doubles for each step on the Stouffer scale. By using a solid 1 or 2 according to the invention (as compared to the normal solid 6) a substantial time savings is realized. Toughness is imparted to the image via the UV curable material which can be quickly cured with a high intensity UV source.

The lithographic substrate 10 can be a single sheet or a laminate and can be rigid or flexible. The substrate 10 may be a coated paper, a plastic film or sheet or a metallic sheet. The preferred lithographic substrate is anodized aluminum which may be pretreated before anodizing to roughen or grain the surface, for example using mechanical, chemical or electrochemical techniques as are well known in the art and it may be post-treated after anodizing, for example as described in Fromson U.S. Pat. No. 3,181,461.

The light sensitive coating 12 is preferably a water soluble diazo resin that is commercially available from a number of sources. Other light sensitive materials may be used provided they are water soluble and can be imaged to form a latent image using light of an intensity substantially less than the UV source required to cure the UV resin in the second phase of the invention. Typical light sensitive materials are described in Fromson U.S. Pat. No. 3,773,514 referred to previously.

UV curable materials suitable for use in the invention are commercially available from a number of sources in the form of UV curable inks, coatings, oligomers and monomers. Such commercially available materials can be obtained from the following companies: Inmont Corporation, Sinclair & Valentine, Celanese Chemical Company, 3-M Company, Desoto Chemical Company, Paulimer Industries, Shell Chemical, Mobile Chemical, WR Grace, Design Coat Company, and Ware Chemical Corporation.

UV curable materials including monomers and oligomers are described in the following patents:

| | |
|---|---|
| U.S. Pat. No. 3,297,745 | 1967 |
| U.S. Pat. No. 3,380,381 | 1968 |
| U.S. Pat. No. 3,673,140 | 1972 |
| U.S. Pat. No. 3,770,643 | 1972 |
| U.S. Pat. No. 3,712,871 | 1973 |
| U.S. Pat. No. 3,804,736 | 1974 |

There are also materials that will cure upon exposure to other sources of radiation, for example an electron beam. These curable materials can be used in special applications in the invention and are commercially available. Electron beam curable compositions are described in U.S. Pat. Nos. 3,586,526-30, 1971.

The present invention can be used to make printed circuits by using, in place of a lithographic substrate 10, a composite laminate comprising a base, a conductive layer such as copper and an overlying light sensitive layer 12. Exposure through a negative of a wiring diagram or the like (or exposure with a laser) form an image in the desired conductive areas. After developing (which leaves the conductive layer bare in the non-conducting areas) and curing of the UV coating 14, the non-conductive areas are etched away in the usual fashion. UV curing can follow the etch steps and suitable overcoatings can be used after etching such as a further UV coating and cure.

In another aspect the invention relates to the selective coating of surfaces. The art of coating surfaces for protection and beauty has been known for thousands of years. The art of selectively coating surfaces; i.e., specific areas only, in preference to an entire area has also been known for many years. Selective coating can be achieved by masking, printing, or plating techniques.

The invention provides a method for selectively coating a specific area which takes advantage of the fact that materials have specific polarities, surface tension, and hydrophilic-lipophilic balance (HLB) are properties of materials that can be easily measured and quantified. These properties are also related to adhesion. Materials will coat easily and stick to each other if their polarity, surface tension, or HLB are similar. Adherends will be wet by adhesive coatings and form composites if these values are similar. We have found HLB values and surface tension data arrived at by measuring contact angles, using a contact angle measuring instrument manufactured by Kayeness Inc., Honey Brook, PA, to be very useful. Thus, a surface can be selectively coated by first providing a surface having a single affinity or disaffinity for a given liquid. In other words, the surface at first is either wetted by a given liquid or it is not wetted by a given liquid. If the surface is wetted the contact angle for the given liquid is virtually zero; if it is not wetted, the contact angle will be at least 40°. Selected portions of the surface are then altered such that the given liquid will now wet (or not wet) the selected portions. The surface is then contacted with the given liquid to wet and coat (or vice versa) only the selected portions with the given liquid.

Given a situation in which there is a finite difference in surface tension, polarity or HLB between the area to be coated and its surrounding background, one can apply a coating selectively to coat, protect or beautify the area in question by merely pouring a solution over the entire surface. Upon draining, drying and/or rinsing, a coating will remain on selective areas. This selective coating technique is achieved by choosing the proper combination of binder (coating or protecting material) and solvent. The binder must have a surface tension equal to or approximately that of the areas to be coated selectively. The solvent should have a surface tension equal to or less than the background. Obviously, if the background and area to be selectively coated have identical surfaces with respect to polarity, surface tension or HLB, then selective coating will not take place—nothing will be coated or the entire surface will be coated.

A typical example of differences in surface tension values, as measured by contact angle, of an area to be coated selectively and its surroundings would be contact angle values of between 40° and 70°. In other words a difference of less than 40° in contact angle values between the area to be coated and surrounding area would lead to nondiscrimination.

Ideal substrates for selective coating are metals such as aluminum, chromium, iron, zinc, etc. The oxides of these metals are very hydrophilic or polar. If coated with a photo-sensitive material such as a diazo material and specific areas exposed to actinic light, specific areas can be selectively coated by this novel coating technique. When a specific area of the diazo coated aluminum is exposed to actinic light, the surface tension or polarity of that area is changed considerably from that of the surrounding area. Films substrates or paper substrates with hydrophilic subcoatings such as gelatin, clay, PVOH, hydroxyethyl cellulose or nitro cellulose are also useful. Consequently, solution containing an appropriate coating material, properly formulated according to our novel approach, will selectively coat these exposed areas.

The method of selective adhesion or coating is achieved by proper selection of solvents, adhesives or coating. If the surface to be selectively coated is nonpolar and organic surrounded by an area that is polar, then the solvent chosen for the adhesive should be polar and to some degree water soluble. Typical solvents useful in this novel coating method include alcohols, glycols, and ethers as well as esters of all three. Other water soluble or miscible solvents may also be useful. Typical coatings or adhesives useful in this coating method are fatty acids, oligomers, polymers, and surface active agents having an HLB value of approximately 9 or less.

Solvent to binder ratios can be adjusted over wide ranges depending on particular need or end uses. We have found ratios of between 50/1-1/1-1/50 to be useful. This will ultimately depend on the particular selective coating binder and the method of application. We have found ratios of approximately 10/1 to be particularly useful. The solutions can be dyed, pigmented or clear. The coatings can be used as solutions or as emulsions containing surfactant and/or water soluble polymers.

The coating can be applied in many ways, such as brushing, spraying, immersion, rolling, rubbing, etc. In some cases merely pouring the coating over the surface to be selectively coated, in a cascading mode works extremely well. In most instances, however, the application of some pressure may be necessary. As we have indicated, spontaneous wetting of a substrate vs. induced wetting of a surface is achieved by the proper matching of surface tensions. However, most surfaces are roughened and roughened surfaces present problems because of the countless number and configuration of the hills, valleys and crevices. Even when perfectly wet-out, gas pockets and entrapments may prevent intimate contact of liquid and solid interfaces. Therefore, some pressure or contact is usually necessary for a perfect coating.

Solvents useful in this process are acetone, MEK, cyclohexanone, cellosolve, methyl cellosolve, cellosolve acetate, carbitol, carbitol acetate, ethylene glycol, ethylene glycol diacetate, propylene glycol, glycol diacetate, tetrahydeifuran ethanol and isoprosasol. This list is not meant to be exhaustive, but is an indication of the types of solvents and solvent combinations that find utility in this process.

Coatings or adhesive materials useful in this process are surfactants with an HLB number (hydrophilic-Lithophobic balance—see Atlas Chemical Co. literature for full explanation) of less than 7; such as span 20, 40, 60, 65, 80, 85 (Atlas), Pluromic L31, L101, L122, L81 (BASF), Oligomen 783. 788 (Thiokol), UV curing inks (Inmont-Sinclair & Valentine), epoxy resins 37-001, 37-002, 37-004 (Richhold Chemical Co.), oleic acid soya fatty acid, linseed fatty acid. This list is also not all inclusive but merely a sampling of the types of materials useful in this process.

A good test for selecting solvents and coating materials useful in this invention is the following. Take an aluminum (Alloy 1100) silicated surface (very hydrophilic) and coat it with a light sensitive material such as a diazo salt manufactured by Fairmont Chemical Co. called Diazo resin #4 or Diazom-7 manufactured by Molecular Rearrangements, Inc., Andover, N.J. These materials are very polar and therefor, hydrophilic. A negative or a mask of any image desired is placed in contact with the coated aluminum surface and exposed to high intensity UV light such as that supplied by Nuarc Co. Upon exposure, the open or exposed area is rendered hydrophilic or nonpolar by virtue of actinic light. Coatings of interest that have been formulated using desired materials are then procured or cascaded or sprayed onto the surface of the aluminum. A uniform film of coating should cover the surface completely. When this is achieved the entire surface is then flooded with water or sprayed with water thoroughly. If a selective coating has been achieved as we have described in this invention then an image should be visible that readily sheds water relative to background areas. The image may be transparent or projected.

The following examples are intended to illustrate the invention without limiting same.

EXAMPLE 1

A UV curable coating useful in this invention is prepared by mixing 20 parts of Ultra King Nova Blue Ink (Inmont Chemical Co.) with 80 parts of ethlene glycol diacetate. A brushed grained, anodized aluminum plate is coated with ½% solution of water soluble diazo resin (purchased from Fairmont Chemical Co.). The coating is dried and the plate is placed in a Nu-Arc exposure unit and exposed through a negative for ten seconds to form a latent image. After exposure a small amount of the UV coating described above is applied to a sponge and lightly applied to the exposed plate surface. Immediately an intense image becomes visible. When the plate is uniformly developed it is coated with a light coating of Gum Arabic (10%). The plate is then passed under a high intensity UV light source such as produced by PPG Industries (MOD-1 unit—200 to 300 watts). Upon exiting from the high intensity light source a very tough, abrasive resistant image is realized. The abrasive resistance is tested with a red rubber eraser or a Gardner washability machine. Relative to conventionally exposed and lacquered diazo plates-these coatings are extremely tough.

EXAMPLE 2

A UV coating similar to Example 1 is prepared and placed in a roller coater. A brush grained anodized diazo coated plate (as per Example 1) is top coated with the UV coating. The thin coating is allowed to dry. It is then placed in a Nu-Arc exposure unit and exposed for ten seconds through a negative. The exposed plate is then sprayed with water. The background is immediately subtracted from the plate, leaving a diazo image topped with the UV curable coating. The plate is then treated with a solution of Gum Arabic and passed under the high intensity UV light source at approximately 10 feet per minute. Results are the same as in Example 1.

EXAMPLE 3

A UV coating similar to Example 1 is prepared and a diazo coated plate is top coated as in Example 2. This time the UV top coated plate, after imaging through a negative, is passed through a National 330 plate processor. The first two stations contain only water and the last station gum. Upon exiting from the machine the plates are passed under the high intensity UV light source as in Example 1. Five plates are prepared this way using newspaper negatives. The plates are placed on a Goss Metro Offset Press. 170,000 quality images are realized from these plates. The plates were inspected after and it was noted that little if any wear could be noticed in the image area.

EXAMPLE 4

A two-phase emulsion of a UV curable coating is prepared in the following manner:

| Ink/Solvent | Gum Phase |
| --- | --- |
| 6 Parts Inmont Nova Blue UV Ink. | 50 Parts Gum Arabic (8° Be) |
| 10 Parts Span 80 (ICI Chemical Co.) | 10 Parts Pluronic (HLB 30 Pluronics made by BASF Corp.) |
| 24 Parts Cellosolve Acetate | |

The two phases prepared above are then mixed together with vigorous agitation. An aluminum plate diazo coated and exposed as described in Example 1 is then treated with this two-phase emulsion by lightly rubbing with a sponge, cloth, or pad. The plate is rinsed, dried, passed under the high intensity UV light source resulting in a very tough abrasive resistance offset plate image ready for press.

Example 5

| A UV curable coating is prepared as follows: |  |
| --- | --- |
| 9 Parts | UVIMER #530 (an oligimer sold by Polychrome Corp.) |
| 1 Part | Trimethylol Propane Triacrylate (Ware Chemical Corp.) |
| 0.5 Parts | Benzophenone |
| 0.5 Parts | Dimethyl Aminoethenol |
| 89 Parts | Cellosolve Acetate |
| 100 Parts | Total |

This UV curable coating is applied to a diazo coated plate prepared and exposed as in Example 1. Abrasive tests performaned on this material using a Gardner washability machine are judged as excellent.

EXAMPLE 6

A UV curable coating designated X-437-90 purchased from Polymer Industries diluted with diethyleneglycol diacetate (10/90) is sprayed onto an aluminum plate diazo coated and exposed as in Example 1. After spraying, the material adheres tenaciously to the latent image and the background cleans up immediately when further sprayed with water. The plate is gummed, dried and cured under the high intensity UV source. Comparable results are obtained, that is, a high quality, tough image results.

EXAMPLE 7

Brushed grained, anodized, silicated aluminum plates coated with a ½% solution of diazo resin are placed in a Log-E Laser plate maker containing a YAG Laser. The plates are scanned in approximately two minutes then removed and treated with UV coating prepared as in Examples 1 and 4. The latent images produced by laser exposure are thus amplified to strong, intense images. After passage under the high intensity UV source of Example 1 a press ready plate, capable of 250,000 impressions is made.

EXAMPLE 8

An area on a piece of mylar film may be selectively coated in the following manner. The mylar film is first subbed as most films for photographic purposes usually are with a hydrophilic coating such as gelatin, polyvinyl alcohol, polyvinylpyrrolidon and polyacrylimide. The film is then coated with a light sensitive diazo material (from Fairmont Chemical Co.). The film is then exposed through a mask of the particular image desired. Exposure via actinic radiation creates a change in polarity. The exposed film is then coated by pouring or cascading a solution consisting of 20 parts blue Ultra King UV curing ink (Inmont Chemical) and 80 parts ethylene glycol diacetate. Upon draining and spraying with water, a visible enhanced image appears selectively in the area exposed by actinic radiation.

EXAMPLE 9

A UV curable coating useful in this invention is prepared by dissolving 20 parts of Nova blue UV curing ink (Inmont Chemical) and 80 parts of cellosolve acetate. Next, an anodized silicated aluminum sheet 0.0085 inches in thickness and anodized for approximately 50 ampere-minutes is placed in a heat transfer press (Solomon Brothers Associates, Atlanta, Ga.). To print offset on paper, the print consisting of inks prepared with sublimatable dyes (Crompton & Knowles) is placed face down on the aluminum surface, heat and pressure are applied (60 psi at 370° F.) for 30 seconds. After removal from the press the dyed images are then selectively coated for protection with a coating of the following formulation:

| 9 Parts | Uvimer #530 (an oligimer sold by Polychrome Corp.) |
| --- | --- |
| 1 Part | Trimethylol Propane Triacrylate (Ware Chemical Corp.) |
| 0.5 Parts | Benzophenone |
| 0.5 Parts | Dimethyl Aminoethenol |
| 89 Parts | Cellosolove Acetate |
| 100 Parts | Total |

The coating is poured over the surface of the plate. Rinse with water or wipe with damp sponge. It is then seen that the coatings selectively adhere to the dyed areas only. The selective coating is then passed under a high intensity UV light source such as produced by PPG Industries (MOD-1 unit). An abrasion resistant, selectively coated image results.

EXAMPLE 10

A brush-grained aluminum sheet, silicated and anodized, is placed in the Log E laser (YAG) apparatus. A film mask produced by Scott Graphics is placed face down on the aluminum sheet. The mask/plate composite is scanned with the YAG laser using a newspaper positive as read material. A positive image is left on the aluminum sheet and a negative image remains in the mask due to ablation by the laser.

This image is not substantive to the substrate and must be reinforced. A selective coating such as that used in Example 1e is poured or coated onto the surface of the plate. The plate is rinsed, dried and exposed by a high intensity UV light source. The resulting selectively coated material is now very substantive and abrasion resistant.

EXAMPLE 11

It is desired to make a water repellent area on a paper substrate coated with a sublayer such as in Example 1. The paper is coated and exposed through a mask containing the desired area and treated with a selective coating consisting of 90 parts ethylene glycol diacetate and 10 parts of oleic acid. By pouring this solution over the substrate, rinsing and drying, a water repellent area is achieved.

EXAMPLE 12

A selective coating consisting of an epoxy resin, 37-002 purchased from Reichhold Chemical Co., cellosolve acetate, and a red solvent-soluble dye (Sandoz) is used as a selective coating for devorative purposes on aluminum. An aluminum sheet, anodized and silicated, is coated with a light sensitive diazo material exposed to actinic radiation through a mask containing the desired decorative image. The red selective coating is poured over the surface of the entire plate, drained off and the plate surface rinsed. A red image on an aluminum background suitable for decorative purposes is thus achieved.

What is claimed is:

1. Apparatus for making a lithographic printing plate which comprises:
    (a) means for applying a water soluble light sensitive coating to a lithographic plate and for applying a coating of a solvent soluble UV curable material thereover;
    (b) means for exposing to actinic light the lithographic plate having the water soluble light sensitive layer thereon and the overcoating of a solvent soluble UV curable material, the intensity of said means being sufficient to form an image in the light sensitive layer and to adhere the image to the overlying portions of the UV curable material without curing the UV curable material;
    (c) means for developing the plate with water to remove light sensitive layer and overlying UV curable material in the non-image area; and
    (d) means for exposing the plate to a UV source having an intensity greater than the imaging light means of paragraph (b), said UV source having an intensity sufficient to cure the UV material to form a press-ready plate having a durable, reinforced cured image thereon.

2. Apparatus of claim 1 wherein the means for exposing is a laser.

* * * * *